(12) United States Patent
Armagnat (10) Patent No.: US 7,739,566 B2
(45) Date of Patent: Jun. 15, 2010

(54) SCAN TEST CIRCUITRY USING A STATE MACHINE AND A LIMITED NUMBER OF DEDICATED PINS

(75) Inventor: Paul Armagnat, Seyssinet (FR)

(73) Assignee: STMicroelectronics S.A., Montrouge (FR)

(*) Notice: Subject to any disclaimer, the term of this patent is extended or adjusted under 35 U.S.C. 154(b) by 502 days.

(21) Appl. No.: 11/698,249

(22) Filed: Jan. 24, 2007

(65) Prior Publication Data
US 2007/0260953 A1 Nov. 8, 2007

(30) Foreign Application Priority Data
Jan. 27, 2006 (FR) .................... 06 00787

(51) Int. Cl.
*G01R 31/28* (2006.01)
*G06F 3/00* (2006.01)

(52) U.S. Cl. ........................ 714/726; 710/33
(58) Field of Classification Search .............. 714/724, 714/726; 370/395.5, 469; 710/106, 33
See application file for complete search history.

(56) References Cited

U.S. PATENT DOCUMENTS

| | | | | |
|---|---|---|---|---|
| 5,623,500 A | * | 4/1997 | Whetsel, Jr. ................ | 714/724 |
| 6,154,856 A | * | 11/2000 | Madduri et al. ............ | 714/27 |
| 6,836,757 B1 | * | 12/2004 | Swoboda .................... | 703/25 |
| 6,854,029 B2 | * | 2/2005 | Davis ......................... | 710/100 |
| 2002/0191640 A1 | * | 12/2002 | Haymes et al. ............. | 370/466 |
| 2007/0204089 A1 | * | 8/2007 | Proctor ....................... | 710/301 |

OTHER PUBLICATIONS

"Protocol conversion" by Lam, S.S. This paper appears in: Software Engineering, IEEE Transactions on Publication Date: Mar. 1988 vol. 14, Issue: 3 On pp. 353-362 ISSN: 0098-5589.*
"A method and a tool for errors recovering in communication protocols" by Viho This paper appears in: Systems, Man and Cybernetics, 1993. 'Systems Engineering in the Service of Humans', Conference Proceedings., International Conference on Publication Date: Oct. 17-20, 1993 On pp. 379-384 vol. 1 ISBN: 0-7803-0911-1 Inspec Accession No. 4896543.*
"IEEE standard test access port and boundary-scan architecture" This paper appears in: IEEE Std 1149.1-2001 Publication Date: 2001 On pp. 1-200 ISBN: 0-7381-2944-5.*
Preliminary French Search Report, FR 06 00787, dated Dec. 5, 2006.

* cited by examiner

*Primary Examiner*—Cynthia Britt
(74) *Attorney, Agent, or Firm*—Gardere Wynne Sewell LLP (57) ABSTRACT

An electronic circuit includes a group of devices which facilitate scan testing of at least one part of the electronic circuit. Those devices include a scan test device. The circuit further includes a state machine which operates to transfer data from an input pin of the circuit which is dedicated to the state machine to the devices relating to scan testing. The state machine supports a plurality of data transfer protocols. The choice of the protocol to be used is made as a function of a signal received on the input pin. Responsive to an input pin signal, the state machine enters an operational mode wherein scan test programming data is serially received at the input pin and communicated to the devices which facilitate scan testing. More specifically, the scan test programming data is serially communicated to a scan test register, where the data is output in parallel to the scan test device.

25 Claims, 4 Drawing Sheets

SCAN TEST CIRCUITRY USING A STATE MACHINE AND A LIMITED NUMBER OF DEDICATED PINS

PRIORITY CLAIM

The present application claims priority from French Patent Application No. 06 00787 filed Jan. 27, 2006, the disclosure of which is hereby incorporated by reference.

BACKGROUND OF THE INVENTION

1. Technical Field of the Invention

The present invention relates to the field of testing of electronic circuits, and in particular to the testing of digital electronic integrated circuits.

2. Description of Related Art

A digital electronic circuit is customarily fabricated on the basis of what is called an RTL description (standing for "Register Transfer Level") which describes the operations of the circuit in an appropriate programming language, for example, one of the C, Verilog or VHDL language (standing for "Very High Speed Integrated Circuit Hardware Description Language"). An RTL description can customarily be validated with the aid of simulation software tools.

A description at the logic level (called a "netlist"), describing a set of logic gates (corresponding to assemblies of transistors) and of connections, can be synthesized on the basis of the RTL description. The operation of a netlist can be validated by virtue of functional tests.

Steps of placement and routing lead to a drawing of the masks (called a "layout") on the basis of the description at the logic level. Thereafter, what is called an LVS test (standing for "Layout versus Schematic") can be executed so as to verify that the layout does indeed correspond to the logic description.

Then the circuit is fabricated on the basis of the layout.

The fabricated circuit must finally be tested so as to verify that no logic gate is "stuck" at a fixed value ("stuck at 0 or stuck at 1"), because of, for example, a short-circuit. To thus test the fabricated circuit, it is known to carry out what is called a scan test. Scan tests use the principle according to which any digital circuit consists of a relatively easy to test combinatorial part and of a sequential part limited to D-type flip-flops. The D-type flip-flops can be connected together by virtue of multiplexers to make it possible readily to control the signals dispatched or received from the combinatorial part.

Figure 1:
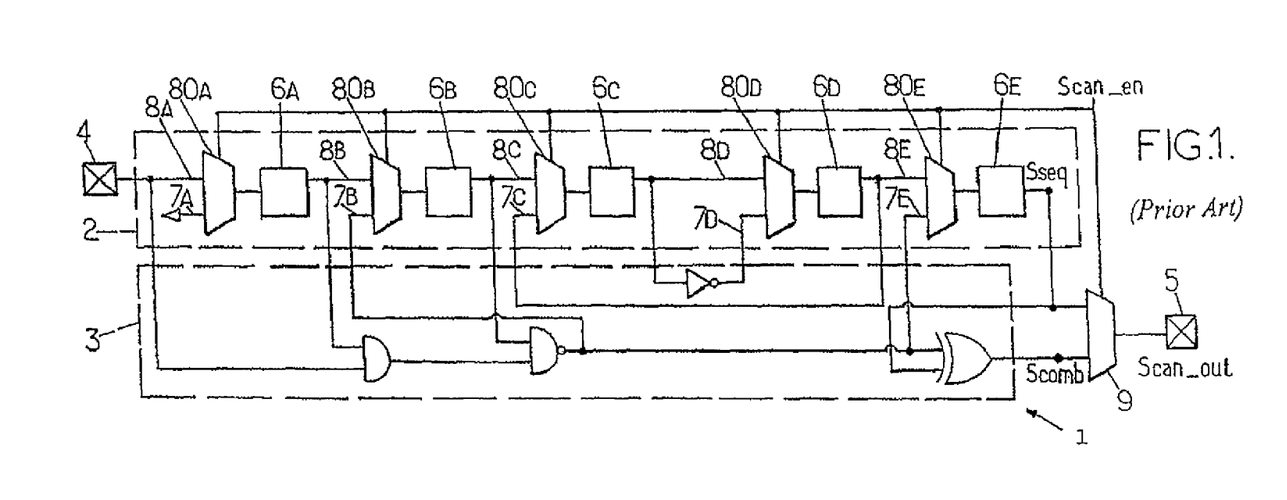
FIG. 1, already commented on, shows an exemplary digital part of an electronic circuit able to be tested by a scan test, known from the prior art.

FIG. 1 shows an exemplary digital part of a relatively simple electronic circuit able to be tested by a scan test. The digital part 1 comprises a sequential part 2 and a combinatorial part 3. The sequential part 2 comprises flip-flops $6_A$, $6_B$, $6_C$, ..., of type D each associated with a multiplexer $80_A$, $80_B$, $80_C$, ..., and grouped into a chain 2. Each of the flip-flops $6_A$, $6_B$, $6_C$, ..., comprises a data input respectively $7_A$, $7_B$, $7_C$, ..., a scan input respectively $8_A$, $8_B$, $8_C$, ..., an output respectively $8_B$, $8_C$, $8_D$, ..., a clock input, not represented, and an enabling input controlled by an enabling signal scan_en. When the enabling signal is at a logic "1" level, the logic state of the scan inputs $8_A$, $8_B$, $8_C$, ..., is copied over to the corresponding outputs $8_B$, $8_C$, $8_D$, ..., at each rising clock edge. On the other hand, when the enabling signal is in a logic "0" state, the logic state of the data inputs $7_A$, $7_B$, $7_C$, ..., is copied over to the corresponding outputs $8_B$, $8_C$, $8_D$, ..., at each rising clock edge.

The enabling signal scan_en also commands a switch 9. When the signal scan_en is in a logic "0" state, the signal scan_out at the output 5 of the electronic circuit takes the value of the signal $S_{comb}$ at the output of the combinatorial part 3, termed the functional output. When the signal scan_en is in a logic "1" state, the signal scan_out at the output 5 takes the value of the signal $S_{seq}$ at the output of the sequential part 2, termed the scan output.

Figure 2:
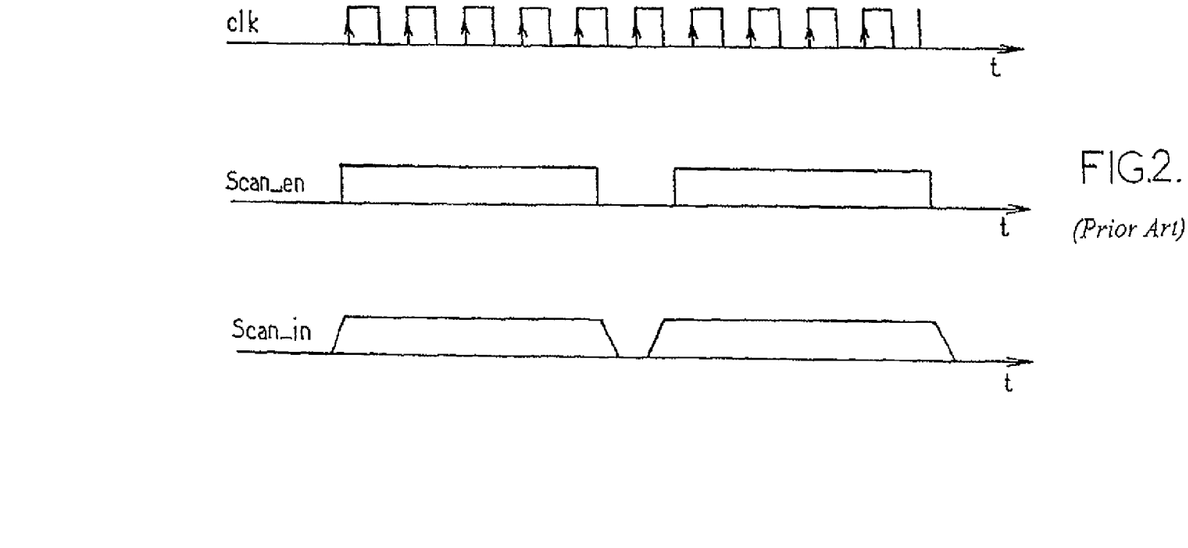
FIG. 2, already commented on, shows exemplary time-charts illustrating the conduct of a scan test known from the prior art.

FIG. 2 shows timecharts illustrating the manner of operation of a scan test of the digital part represented in FIG. 1.

Initially, the signal scan_en takes a nonzero value lasting, for example, five clock cycles, thus allowing shifts within the chain 2. The chain 2 comprising five flip-flops, five clock cycles are therefore necessary for loading the chain with new input values.

After these five cycles, the signal scan_en goes to zero. The outputs of the flip-flops then take values prescribed by outputs termed secondary $7_B$, $7_C$, $7_D$, $7_E$ of the combinatorial part 3. The value of the signal $S_{comb}$ is read at the output termed primary of the combinatorial part 3, that is to say the functional output.

This is subsequently followed by five new shift cycles within the chain, the signal scan_en having resumed a nonzero value. At each clock cycle, a value of the signal $S_{seq}$ is read at the output of the chain 2. Stated otherwise, the secondary outputs are read one by one during these five cycles termed purge cycles. These five purge cycles make it possible furthermore to reload the chain with new input values.

Each sequence of five values of the input signal is called a test vector. Methods of automatic test program management or ATPG (standing for "Automatic Test Pattern Generator") make it possible to generate test vectors intended to be placed at the input scan_in of the chain. The values of the signals of the test vectors are such that, if the fabricated circuit is operationally correct, all the connections must change value at least once during the conduct of the scan test.

In practice, for more complex digital circuits, the chain can comprise a relatively high number of flip-flops, for example, of the order of a thousand or some ten thousand. Such a chain length renders the duration of reading of the values of the secondary outputs relatively lengthy. The scan test is therefore also relatively lengthy.

It is known to arrange several relatively short chains rather than a single relatively long chain, so as to avoid excessive test durations. A single enabling input signal scan_en and a single clock signal clk can control all the chains. On the other hand, with each scan chain are associated an input scan_in and an output scan_out respectively. The number of pins required for performing the scan test therefore increases with the number of chains. This is a drawback.

Specifically, the complexity of the routing of the tracks of the card comprising the electronic circuit increases with the number of pins, as well as the risk of congestion. It may also be possible to reuse already hard-wired pins, in which case a multiplexer will have to be envisaged for each reusable pin, thereby running the risk of decreasing the speed of operation of the circuit. Furthermore, it may possibly be necessary to adapt the I/O cells of the pins to be reused so that the command cells support other types of signals. The consumption also increases with the number of pins.

An optimization between the number of pins and the duration of the test must therefore be performed.

Figure 3:
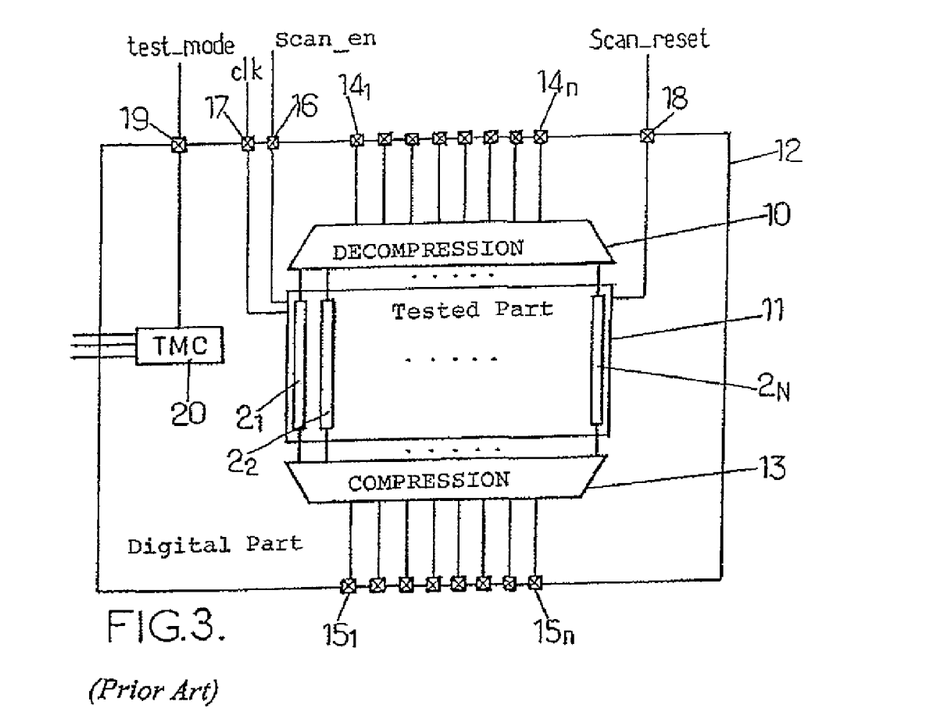
FIG. 3, already commented on, shows an exemplary digital part of an electronic circuit of which a part is able to be tested by a scan test known from the prior art.

In practice, the vectors generated by ATPG methods contain relatively little effective information. This is related to the very structure of combinatorial logic. It is known to profit from this ineffectiveness by using, as shown in FIG. 3, relatively short scan chains $2_1$, $2_2$, ..., $2_N$. The scan chains $2_1$, $2_2$, ..., $2_N$ are loaded via a logic combination of a reduced number of inputs called pseudo scan_in at the pins $14_1$, ..., $14_n$. These logic combinations are carried out by a decompressor 10. The outputs of these short chains are connected to compression logic 13 whose outputs called pseudo scan_out are dispatched to the pins $15_1, \ldots, 15_n$.

ATPG methods are capable of generating vectors termed compressed applicable directly to the pins $14_1, \ldots, 14_n$. These vectors have a smaller length than the ATPG vectors, so that the duration of the test is then lower overall.

In FIG. 3, the digital part 12 comprises a tested part 11, decompression means 10 and compression means 13. The tested part 11 comprises a relatively high number N of chains $2_1, 2_2, \ldots, 2_N$ and combinatorial parts not represented in FIG. 3.

The tested part 11 is linked to an enabling pin 16, to a clock pin 17 and to a pin 18 for resetting to zero of the scan test.

Moreover, a command register 20 or TMC (standing for "Test Mode Control") makes it possible to store certain command parameters of certain analog parts not represented, such as, for example, a phase-locked loop or PLL, or else yet another multiplexer. These parameters, for example, control the wiring of a PLL, or else also the programming of a multiplexer. The TMC 20 thus makes it possible to place the fabricated circuit in a desired mode, and in particular in a desired test mode. The TMC 20 can, for example, be programmed via a standard interface, for example, 12C (standing for "Inter Integrated Circuit"). This programming generally requires at least one digital pin 19.

The decompression means 10 make it possible to transform a relatively low number n of compressed input vectors into N chain input vectors. The compression means 13 make it possible to transform N chain output vectors into n compressed output vectors. N can, for example, be of the order of a hundred, while n can be of the order of about ten. It is thus possible to obtain relatively short test durations, on account of the number N of chains $2_1, 2_2, \ldots, 2_N$, with a relatively low number 2*n of pins $14_1, 14_n, 15_1, \ldots, 15_n$.

However, a compression is effective only onwards of a certain number of vectors, typically 7 or 8. Thus, for n=8, the compression rate is about 50, so that N is about 400. For n=5, the compression rate is about 10 only. But, for a number n of 8, eight input pins $14_1, 14_n$ and eight output pins $15_1, \ldots, 15_n$ dedicated to the scan test are required, i.e. sixteen pins to be added to the enabling pin 16, to the clock pin 17, to the pin for resetting to zero of the scan test 18 and to the digital pin 19.

Thus, in the case of circuits comprising a relatively reduced number of pins, this compression might not be performed in an effective manner, so that the duration of the test may still be relatively high.

The IEEE 1149.1 specification, the disclosure of which is hereby incorporated by reference, proposes the use of a state machine to decrease the number of pins dedicated to (that is to say reserved for) the scan test. The state machine is controlled by a certain number of pins dedicated to the state machine: a command pin TMS, a data pin TDI, a clock pin TCK, a resetting to zero pin TRSTN and an output pin TDO. The state machine makes it possible to transmit the data received at the data pin TDI to the input of the desired chain by using a predefined protocol. However, having regard to the complexity of the scan test, this management can turn out to be inoperative, in particular in the case of a compression.

Generally, the known scan tests require a certain number of pins reserved for the scan test. There is a need to limit the number of pins thus dedicated to the scan test, so as to reduce the associated proportions.

SUMMARY OF THE INVENTION

According to a first aspect, an embodiment of the invention is an electronic circuit comprising a group of devices, the group of devices comprising a scan test device which functions to test at least one part of the electronic circuit, and a state machine which transfers data from an input pin dedicated to the state machine to the devices of the group of devices. The state machine supports a plurality of data transfer protocols, the choice of the protocol to be used being made as a function at least of a signal received on the input pin.

The state machine thus moves from one state to the other as a function of the signal received on the input pin reserved for the state machine. The current state of the state machine functions to address such or such device of the group of devices for the transfer of the data, thereby allowing for a decrease the number of pins necessary for the operation of these devices.

Moreover, the state machine selectively uses one from among several data transfer protocols: this flexibility allowing for a decrease in the number of pins reserved for the state machine. For example, the input pin alone can be reserved for the state machine, the other pins involved in the operation of the state machine being invoked only when the state machine is in certain states. Alternatively, one or more other pins, for example, an output pin, can also be reserved for the state machine.

The electronic circuit, for example, an integrated circuit, can thus implement a scan test with relatively few pins dedicated to the scan test.

In an example, the plurality of protocols that the state machine supports can comprise at least one protocol in which the signal received at a clock pin plays the role of clock signal of the state machine, and at least one protocol in which the role of clock signal of the state machine is ensured by another signal. Thus, the state machine can decide to invoke the clock pin only if need be, so that a clock pin reserved for the state machine is not necessarily required.

In an example, the state machine is placed selectively in one from among a plurality of operating modes comprising a scan test mode. The plurality of protocols that the state machine supports can then comprise at least two distinct operating protocols each corresponding to a respective one of the operating modes of the plurality of operating modes. Thus, the state machine can use such or such operating protocol according to the operating mode. In particular, the at least two operating protocols can be suitable for their respective operating modes, so as to avoid irksome steps when the state machine is in one of the operating modes. Thus, the state machine can operate relatively fast, contrary to the state machines of the prior art subject to an immutable protocol. Furthermore, when an operating protocol is adopted, the state machine can decide to use or to no longer use such or such a pin, thus making it possible to decrease the number of pins reserved for the state machine.

The plurality of operating modes can in particular comprise a plurality of different test modes comprising the aforesaid scan test mode. The plurality of operating modes can also comprise modes making it possible to fulfill a function other than testing.

The present invention is of course not limited to these examples of protocols.

In particular, the group of devices can also comprise a command device for prescribing the operating mode in which the state machine must be placed. This device is itself programmed by the state machine. The latter adopts such or such an operating mode as a function of the programmed values, thus according a certain flexibility and a certain swiftness to the selection of an operating mode.

Advantageously, the plurality of protocols that the state machine uses comprise a mode programming protocol making it possible to program the command device. The state machine can thus adopt a mode programming protocol suitable for the programming of the command device and therefore relatively effective.

Advantageously, the command device comprises a command register for storing command parameters of the operating mode. This register can be a shift register, and can be programmed in series on the basis of the input pin. It is thus possible to avoid dedicated pins or a standard interface for programming the command register.

In embodiments, the group of devices comprises a scan test input device for dispatching test input data to the part of the electronic circuit to be tested, and/or a control device for controlling the conduct of the scan test. The test input device and/or the control device can be programmed via the input pin linked to the state machine.

This example is not limiting: the control device can, for example, be programmed directly by another dedicated pin. Moreover, the invention is not limited by the control/data separation within the scan test device. The scan test device can indeed be arranged differently.

When the group of devices comprises a scan test input device, the latter can advantageously comprise an input register for receiving the test input data to be dispatched to the part of the electronic circuit to be tested. Thus, each bit of the input register can correspond to a chain of flip-flops. The input register, for example, a shift register, is firstly loaded bit by bit on the basis of the input pin dedicated to the state machine, then each bit is dispatched to the corresponding chain of flip-flops. It is thus possible to provide input signals to several flip-flop chains with only an input pin dedicated to the state machine.

Of course, the fact that all the input data originate from one and the same input pin limits a priori the throughput of the input data. However, the shift register makes it possible to artificially create several inputs, for example, about ten, on the basis of a single input pin. If the bits stored in the shift register are dispatched to decompression means, the input data can be decompressed so as to feed a relatively high number of flip-flop chains, of the order of a hundred, as illustrated in FIG. 3. It is thus possible to benefit from the effects of the decompression, namely relatively short test durations, with a single input pin or a very small number of input pins.

When the group of devices comprises a control device, the latter can advantageously comprise a control register intended for storing control parameters for the conduct of the scan test. The control register can, for example, make it possible to store an enabling bit whose value determines whether it is the secondary outputs or the primary output which are read at the output of the chain of flip-flops. This enabling bit can be programmed via the pin dedicated to the state machine, the latter knowing which data item read at the level of this pin corresponds to the enabling bit.

Advantageously, the input register and the control register form part of one and the same shift register, thus allowing relatively fast serial programming of these registers.

According to a second aspect, the invention is aimed at an electronic apparatus comprising an electronic circuit according to the first aspect of the invention described above. The present invention is not limited by the nature of the electronic apparatus, so that it finds applications in varied fields. By way of example, the electronic apparatus can, for example, be a reader of DVDs (standing for "Digital Versatile Disk") or else also a steering control apparatus intended to be carried on board a motor vehicle.

According to a third aspect, the invention is aimed at a method intended to be implemented by a state machine of an electronic circuit, and comprising the steps of selecting a data transfer protocol from among a plurality of data transfer protocols, the selection being made as a function at least of the signal received at an input pin dedicated to the state machine, and transferring, according to the specifications of the data transfer protocol selected, data from the input pin to a device of a group of devices comprising a scan test device, the choice of the device also being made at least as a function of the signal received on the input pin.

This method can, for example, be implemented with the aid of the electronic circuit according to the first aspect of the invention and offers at least the same advantages.

In an embodiment, an integrated circuit comprises: a scan test pin; a test control register; a scan test input register; and a state machine coupled to the scan test pin, test control register and scan test input register, the state machine responsive to a signal received at the scan test pin to enter a test control register programming mode and pass programming data serially received at the scan test pin to the test control register and further responsive to a signal received at the scan test pin to enter a scan test input register programming mode and pass programming data serially received at the scan test pin to the scan test input register.

In another embodiment, an integrated circuit comprises: a scan test input pin; a scan test output pin; a scan test input register; a scan test output register coupled to serially output scan test output data to the scan test output pin; a scan test circuit for testing at least one part of the integrated circuit, the scan test circuit coupled to receive scan test programming data in parallel from the scan test input register and output scan test output data in parallel to the scan test output register; and a state machine coupled to the scan test pin and scan test input register, the state machine responsive to a signal received at the scan test pin to enter a scan test input register programming mode and pass scan test programming data serially received at the scan test pin to the scan test input register.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

Figure 4:
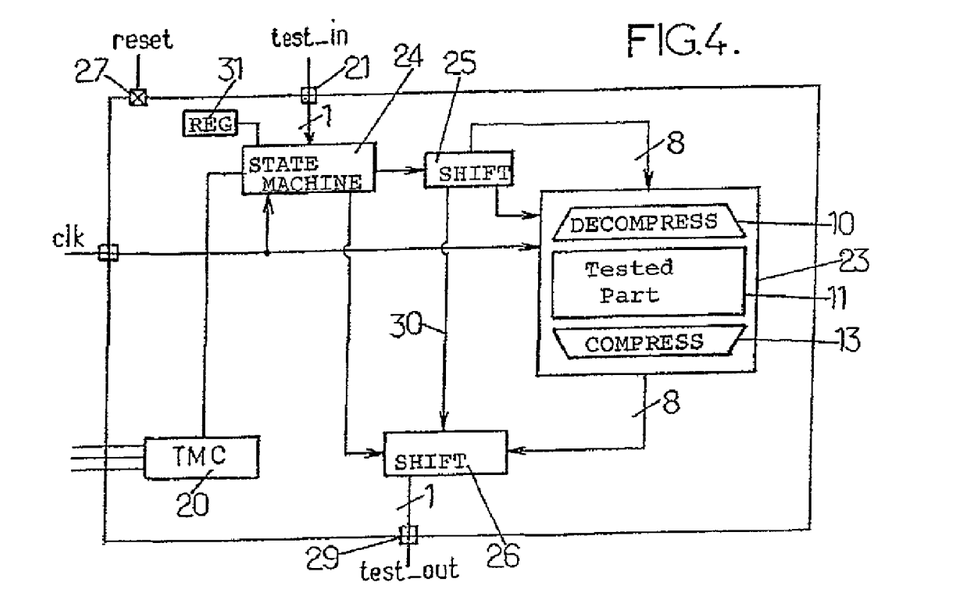
FIG. 4 shows an exemplary digital part of an electronic circuit according to an embodiment of the invention.
Figure 5:
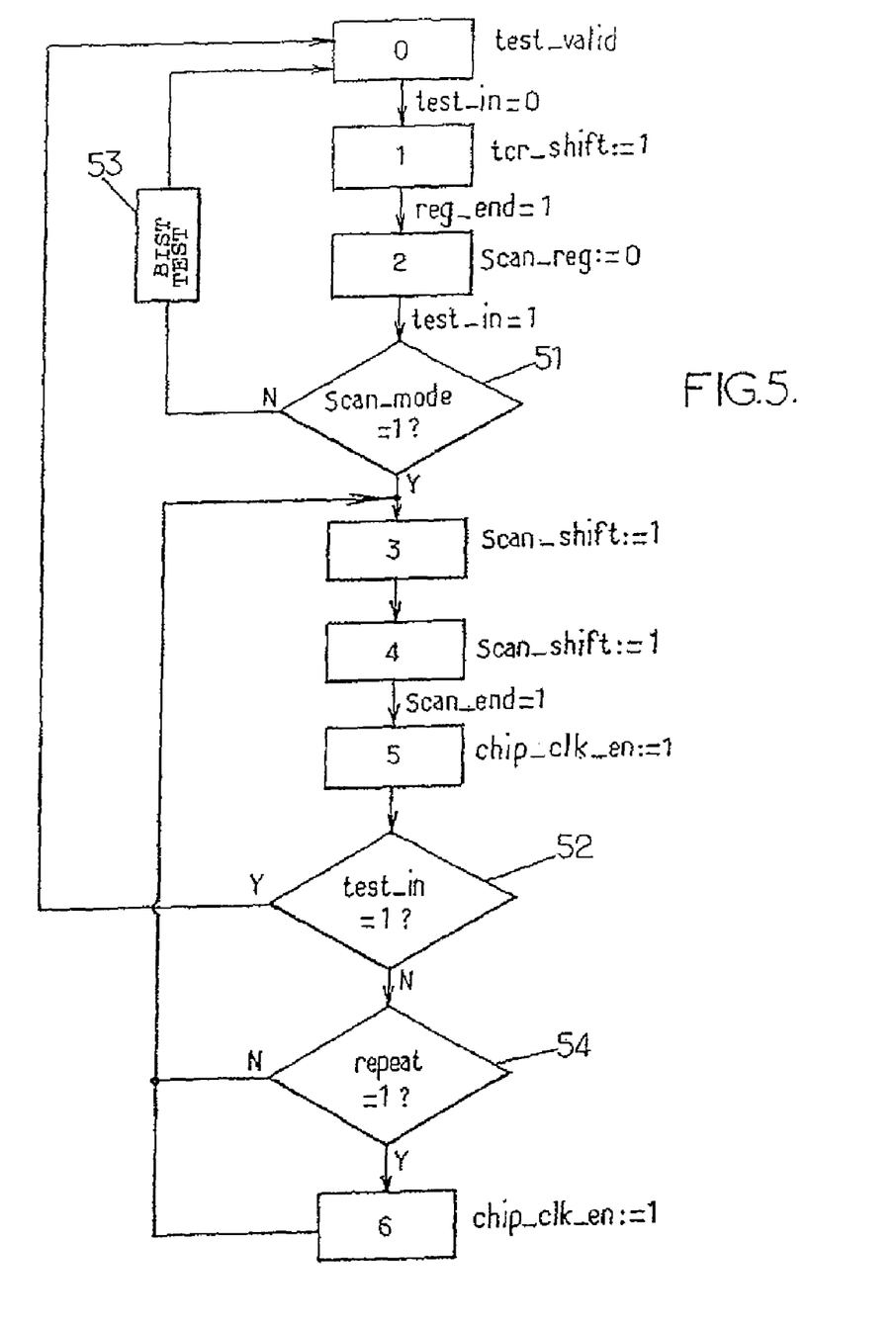
FIG. 5 shows an exemplary algorithm of a state machine of the electronic circuit of FIG. 4.
Figure 6:
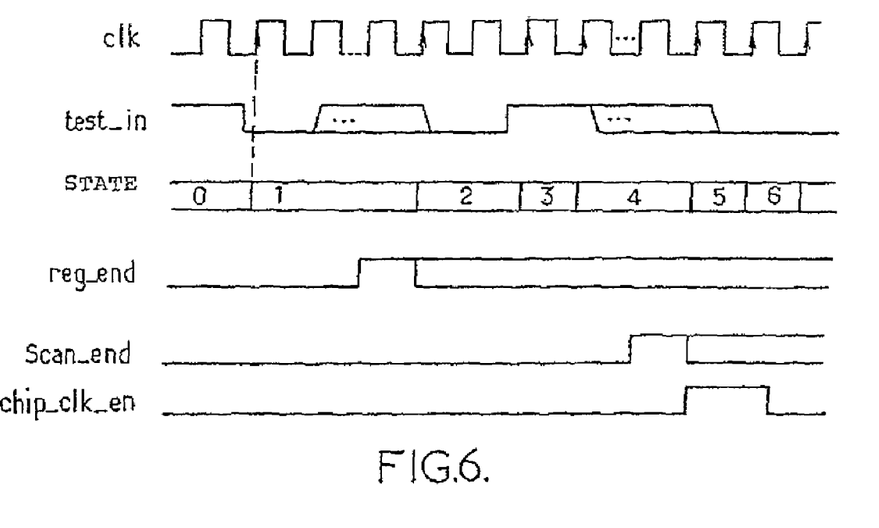
FIG. 6 shows exemplary timecharts illustrating an example of operation of the state machine of the electronic circuit of FIG. 4.

In the embodiment illustrated by FIGS. 4, 5 and 6, an electronic circuit comprises a state machine 24 linked to a digital input pin 21 on the one hand, and to a group of devices 20, 25, 26, 23 on the other hand. The group of devices comprises several scan test devices 25, 26, 23 for a part 11 of the electronic circuit also termed the core.

The group of devices also comprises a command device 20 for prescribing operating modes and in particular test modes. In this example, the device 20 comprises a command register TMC intended to store command parameters of the test mode. The register TMC is a shift register. The register TMC, also termed TCR (standing for "Test Control Register"), makes it possible, for example, to store a memories test parameter or BIST (standing for "Built In Self Test") and a scan test parameter. If the value of the BIST parameter, respectively scan test parameter, is 1, for example, then the register TMC prescribes the carrying out of a BIST test, respectively of a scan test.

The group of devices comprises a device for compression 23 comprising means of decompression 10 and means of compression 13, respectively at the input and output of the tested part 11.

The group of devices can furthermore comprise a first shift register 25, comprising at one and the same time an input register of, for example, eight bits and a control register of, for example, five bits. The input register makes it possible to receive test input data to be dispatched to the decompression means 10. The control register makes it possible to store control parameters for the conduct of the scan test. The shift register is described in detail further on, with reference to FIG. 7.

The group of devices furthermore comprises a second shift register 26 comprising an output register of, for example, eight bits. The output register makes it possible to receive the values read at the output of the compression means 13.

The first and the second shift registers 25, 26 can be linked via a connection 30, for scan test device test purposes (termed a "bypass").

FIGS. 5 and 6 relate to the activity of the state machine and will be commented on simultaneously. In FIG. 5, the states of the state machine are represented by rectangles oriented horizontally. The criterion to be verified to go from one state to the other is written adjacent to the arrow between these two states. When the state machine is in a given state, it can act on such state or such a variable: this variable and the value which is assigned to it are inscribed in a manner adjacent to the rectangle corresponding to the given state.

Initially, the state machine is in a standby state, not represented. The group of devices comprises a standby register 31 in FIG. 4 making it possible to store a standby variable programmed by the state machine 24. In the standby state, the register TMC, the first and second shift registers 25, 26 are empty, that is to say they store zero values. When the input signal test_in goes to 1, the value of the standby variable changes and the state machine goes to a state 0.

In the standby state, it is the input signal test_in which plays the role of clock signal. When the state machine goes to the state 0, it assigns the value 1 to a clock command signal test_valid, this having the effect of rendering a signal clk received at a clock pin accessible. Thus, the signal clk received at the clock pin now plays the role of clock signal. The state machine then goes from one state to the other at the rising edges of the signal clk received at the clock pin, as illustrated in FIG. 6. We therefore go from a protocol where the role of clock signal is played by the signal test_in to a protocol where the role of clock signal is played by the signal clk received at the clock pin.

Alternatively, an internal clock can play the role of clock in the standby state. In the state 0, a possible PLL is cut off so as to be based on the external clock signal clk.

As soon as the state machine goes to the state 0, it uses a mode programming protocol making it possible to program the register TMC. In this example, this protocol requires the state machine to go from the state 0 to the state 1 when the signal test_in reverts to zero, more precisely during the next rising edge of the clock signal clk. A first shift variable tcr_shift then gets assigned a value 1. The register TMC is then programmed bit by bit on the basis of the values of the signal test_in. The state machine therefore determines which values of the signal test_in serve to fill the command register TMC. A counter (not represented) makes it possible to toggle to 1 a bit reg_end when the loading of the register TMC is terminated. The state machine then goes from the state 1 to the state 2.

When the state machine is in the state 2, the programming of the command register TMC is terminated. The register 25 is then reset to 0 with the exception of its first bit which is placed at 1. Furthermore, a backup register, not represented in FIG. 4, is reupdated by copying over at least certain values stored in the command register TMC.

If the signal test_in then goes to 1 or remains at 1, the state machine is driven to a test step 51.

The test 51 pertains to the value of one of the operating mode command parameters programmed in the register TMC, namely a scan test parameter scan_mode.

If this parameter has a zero value, the state machine refrains from placing itself in scan test mode. Other test steps are carried out as regards the values of other operating mode command parameters stored in the command register, for example, a BIST test parameter or a test parameter for analog parts of the fabricated circuit. If one of the latter parameters has a nonzero value, then the state machine selects an operating protocol corresponding to the parameter having a nonzero value, for example, a BIST test protocol or a test protocol for analog parts. The state machine places itself in an operating mode corresponding to the parameter having a nonzero value, and then operates according to the specifications of the selected operating protocol. The state machine can, for example, carry out a BIST test according to the specifications of the BIST test protocol, or else a test of the analog parts according to the specifications of the test protocol for the analog parts.

These other test steps as regards the values of the other command parameters of the operating mode, as well as the consequent operations, for example, the operations of a BIST test, are represented by the vertically oriented rectangle 53.

Thereafter, to go from the state 0 to the state 1, the state machine waits for the input signal test_in to go to 0. The command register TMC can thus be reprogrammed, according to the specifications of the mode programming protocol.

If the parameter scan_mode has a nonzero value, the state machine adopts the scan test protocol, that is to say the state machine goes to the state 3. A second shift variable scan_shift gets assigned a value 1. The state machine thereafter goes into a similar state 4, for synchronization purposes.

When the variable scan_shift has a nonzero value, the first shift register 25 of FIG. 4 is programmed, still on the basis of the values of the signal test_in. The state machine thus makes it possible to program the register TMC and the first shift register on the basis of a single signal test_in.

When the first shift register is full, the value 1 initially loaded attains the last bit scan_end. The state machine then goes from the state 4 to the state 5.

When the state machine is in the state 5, the first shift register is a priori programmed. The shift register comprises eight first bits corresponding to the input register and five bits following these eight bits, these five bits corresponding to the control register. In the state 5, the values of the eight first bits are copied over to the decompression means 10 in FIG. 4. Moreover, if a clk_enable bit of the control register is set to 1, a variable chip_clk_en gets assigned the value 1, thus enabling a clock cycle of the tested part 11.

A test step 54 as regards the value of a repetition bit repeat from among the five bits of the control register is performed.

If this value is nonzero, the state machine returns to the state 3 with a view to a new programming of the first register.

In the converse case, the state machine goes to the state 6, during which a second clock cycle is applied to the tested part. This second clock cycle can make it possible to verify that one of the D-type flip-flops of the tested part switches sufficiently fast. The state machine thereafter returns to the state 3 with a view to a new programming of the first register.

In order to be able to exit a scan test loop grouping together the states 3, 4, 5 and possibly 6, a test step 52 as regards the value of the signal test_in is performed. If the signal test_in has a nonzero value, the state machine returns to the state 0. In the converse case, the test step 54 as regards the value of the repetition bit repeat is then performed.

There exists a direct connection, not represented, between one of the bits of the control register, namely an enabling bit scan_en, and the core 11. The bit scan_en has a nonzero value lasting a certain number of scan test loops, during which each scan chain is loaded with values of the input bits. For scan chains of 1500 flip-flops, 1500 scan test loops are necessary to succeed in loading. During the execution of the following loop, the bit scan_en takes a zero value, so that each flip-flop of each scan chain captures a secondary output value dependent on the combinatorial part corresponding to this chain. The scan chains are thereafter purged by executing a further 1500 loops with the bit scan_en nonzero. The values of the secondary outputs are read at the outputs of the core. This new series of 1500 loops also makes it possible to load the scan chains with values of a new scan test vector.

Figure 7:
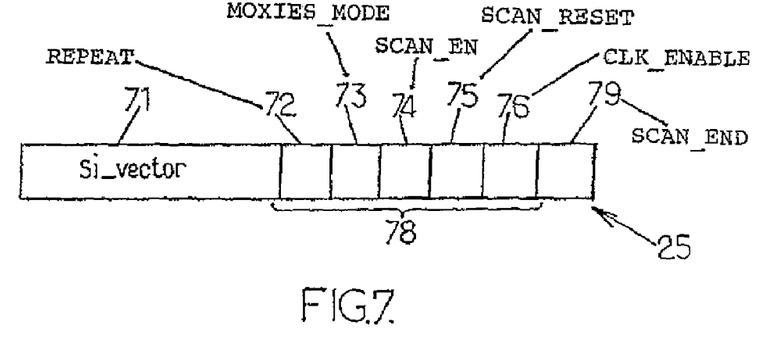
FIG. 7 shows in a more detailed manner the first shift register of the electronic circuit of FIG. 4.

FIG. 7 shows an exemplary scan test register 25 comprising an input register 71, a control register 78, as well as the last bit scan_end 79.

The input register 71 makes it possible to store the values of the bits to be dispatched to the decompression means.

The control register 78 comprises the repetition bit repeat 72, a control bit for the compression moxies_mode 73, the enabling bit scan_en 74, a bit for resetting to zero of the scan test scan_reset 75, and a clock enabling bit clk_enable 76.

The value of the bit moxies_mode 73 makes it possible to determine the operating mode of the decompression means and of the compression means.

When the bit scan_reset 75 is set to 1, the part to be tested is reset to zero.

The bit clk_enable 76 makes it possible to validate or otherwise the clock of the tested part 11.

Variants

The command device might not comprise any shift register. Furthermore, the invention is of course not limited by the presence of a command device for prescribing the operating mode. The state machine can, for example, go from one operating mode to the other following a predefined order.

The command device might not form part of the group of devices and might not be programmed by the state machine.

Neither is the invention limited by the examples of protocols described.

Each protocol, for example, the scan test protocol, can make it possible to transfer data to one or more devices, for example, one or more scan test devices.

In addition to the scan test device or devices, the group of devices can comprise one or more devices making it possible to perform other tests. The group of devices can also comprise one or more devices making it possible to perform functions other than test functions.

The test input device might not comprise any shift register, in particular when no decompression is performed. For example, the state machine can be linked to at least as many pins as there are chains, each chain thus being fed by a corresponding pin.

The control device might not comprise any register for control.

The state machine can be linked to an additional state machine, the additional state machine making it possible to program one or more additional devices.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electronic circuit, comprising:
   a group of devices, said group of devices comprising:
      a test control register; and
      a scan test device which tests at least one part of the electronic circuit, and
   a state machine configured to transfer data from a test data input pin dedicated to said state machine to the devices of the group of devices,
      the state machine supporting a plurality of data transfer processes for transferring data to the devices, the choice of the data transfer process to be used is made and changes between data transfer processes are controlled as a function of signals received on said dedicated test data input pin and the data transfer processes including a first process to transfer data from the dedicated test data input pin to the test control register and a second process to transfer data from the dedicated test data input pin to the scan test device.

2. The electronic circuit according to claim 1, wherein the state machine supports an operation in which the signal received at a clock pin has the role of clock signal of the state machine, and an operation in which the clock signal is provided by the signal received at the dedicated test data input pin.

3. The electronic circuit according to claim 1, wherein:
   the state machine is placed selectively in one from among a plurality of operating modes, said plurality comprising a scan test mode, and
   the plurality of data transfer processes that the state machine supports comprises at least two distinct data transfer processes for transferring data each corresponding to a respective one of the operating modes of the plurality of operating modes.

4. The electronic circuit according to claim 3, wherein the test control register of the group of devices stores data prescribing the operating mode in which the state machine is placed.

5. The electronic circuit according to claim 4, wherein the stored data comprises command parameters of the operating mode.

6. The electronic circuit according to claim 3, wherein the first process comprises a mode programming process through which the test control register is programmed 7. The electronic circuit according to claim 1, wherein the scan test device of the group of devices comprises a scan test input device for dispatching test input data to the part of the electronic circuit to be tested.

8. The electronic circuit according to claim 7, wherein the scan test input device comprises an input register for receiving the test input data to be dispatched to the part of the electronic circuit to be tested.

9. The electronic circuit according to one of claim 7, wherein the scan test device of the group of devices comprises decompression means receiving the test input data, and compression means at the output of the tested part.

10. The electronic circuit according to claim 1, wherein the test control register of the group of devices comprises a control device for controlling the conduct of the test.

11. The electronic circuit according to claim 10, wherein the stored data comprises control parameters for the conduct of the test.

12. The electronic circuit according to claim 11, wherein the scan test device of the group of devices comprises a scan test input device for dispatching test input data to the part of the electronic circuit to be tested; wherein the test input device comprises an input register for receiving the test input data to be dispatched to the part of the electronic circuit to be tested, and wherein the input register and the control register form part of one and the same shift register.

13. The electronic circuit of claim 1 wherein the electronic circuit comprises an electronic apparatus.

14. A method implemented by a state machine of an electronic circuit, comprising:
selecting a data transfer process for data transfer from among a plurality of data transfer processes, the selection being carried out in response to a signal received at a test data input pin dedicated to the state machine,
transferring, according to specifications of the selected data transfer process, test data from the test data input pin to a device of a group of devices, a choice of said selected data transfer process and device for data transfer being made in response to the signal received on said test data input pin, said group of devices comprising a test control register and a scan test device, and
changing between selected data transfer processes for data transfer to the test control register and scan test device in response to the signal received on said test data input pin.

15. An integrated circuit, comprising:
a scan test integrated circuit test data input pin;
a test control register;
a scan test input register; and
a state machine directly connected to the scan test integrated circuit test data input pin, and coupled to the test control register and scan test input register,
wherein the state machine is operable in a plurality of individual states and is responsive to a first signal received at the scan test integrated circuit test data input pin to change to first of the states associated with programming the test control register with programming data serially received at the scan test integrated circuit test data input pin and further responsive to a second signal received at the scan test integrated circuit test data input pin to subsequently change to a second of the states associated with programming the scan test input register with programming data serially received at the scan test integrated circuit test data input pin.

16. The circuit of claim 15 further comprising a scan test circuit for testing at least one part of the integrated circuit, the scan test circuit coupled to the scan test input register to receive programming data in parallel.

17. The circuit of claim 16 wherein the scan test circuit includes a decompression circuit for decompressing the programming data received in parallel from the scan test input register.

18. The circuit of claim 17 wherein the scan test circuit includes a compression circuit for compressing scan test results for parallel output.

19. The circuit of claim 16 further comprising:
a scan test output register coupled to receive scan test results output in parallel from the scan test circuit; and
a scan test data output pin coupled to the scan test output register to serially output the scan test results from the integrated circuit.

20. The circuit of claim 19 further comprising a bypass connection between the scan test input register and the scan test output register to communicate programming data there between in a manner which bypasses the scan test circuit.

21. The circuit of claim 15 further including a clock integrated circuit pin receiving a clock signal, the state machine including a first mode wherein an operating clock is provided through the scan test integrated circuit test data input pin and a second mode wherein the operating clock is provided through the clock integrated circuit pin.

22. An integrated circuit, comprising:
a scan test integrated circuit test data input pin;
a scan test integrated circuit test data output pin;
a scan test input register;
a scan test output register coupled to serially output scan test output data to the scan test integrated circuit output pin;
a scan test circuit configured to test at least one part of the integrated circuit, the scan test circuit coupled to receive scan test programming data in parallel from the scan test input register and output scan test output data in parallel to the scan test output register; and
a state machine directly connected to the scan test integrated circuit test data input pin and coupled to the scan test input register,
the state machine having a scan test loop of operating states entered into responsive to a first signal received at the scan test integrated circuit test data input pin to transfer scan test programming data serially received at the scan test integrated circuit test data input pin to the scan test input register, the state machine exiting the scan test loop of operating states responsive to a second signal received at the scan test integrated circuit test data input pin.

23. The circuit of claim 22 further comprising a bypass connection between the scan test input register and the scan test output register to communicate programming data there between in a manner which bypasses the scan test circuit.

24. The circuit of claim 22 further including a clock integrated circuit input pin receiving a clock signal, the state machine including a first mode wherein an operating clock is provided through the scan test integrated circuit test data input pin and a second mode wherein the operating clock is provided through the clock integrated circuit input pin, the second mode corresponding to execution of scan testing by the scan test circuit.

25. The circuit of claim 22 further comprising a test control register, wherein the state machine having another operating state entered into responsive to a third signal received at the scan test integrated circuit test data input pin to transfer programming data serially received at the scan test integrated circuit test data input pin to the test control register.

* * * * *